(12) United States Patent
Beale et al.

(10) Patent No.: US 9,054,659 B2
(45) Date of Patent: Jun. 9, 2015

(54) APPARATUS AND METHOD FOR THERMAL INTERFACING

(75) Inventors: Gary Beale, Stirling (GB); Eamon McErlean, Alloa (GB)

(73) Assignee: Emblation Limited, Inglewood, Alloa (GB)

( * ) Notice: Subject to any disclaimer, the term of this patent is extended or adjusted under 35 U.S.C. 154(b) by 82 days.

(21) Appl. No.: 13/810,320

(22) PCT Filed: Jul. 15, 2011

(86) PCT No.: PCT/GB2011/001059
§ 371 (c)(1),
(2), (4) Date: Feb. 27, 2013

(87) PCT Pub. No.: WO2012/007722
PCT Pub. Date: Jan. 19, 2012

(65) Prior Publication Data
US 2013/0154748 A1    Jun. 20, 2013

Related U.S. Application Data

(60) Provisional application No. 61/364,890, filed on Jul. 16, 2010.

(51) Int. Cl.
*H03F 1/00* (2006.01)
*H03F 3/04* (2006.01)
*H03F 1/52* (2006.01)
(Continued)

(52) U.S. Cl.
CPC .............. *H03F 1/523* (2013.01); *Y10T 29/41* (2015.01); *H01L 23/36* (2013.01); *H01L 23/367* (2013.01); *H01L 23/3737* (2013.01); *H01L 23/427* (2013.01); *H01L 23/492* (2013.01); *H01L 21/00* (2013.01); *H01L 2924/0002* (2013.01)

(58) Field of Classification Search
USPC .......................................... 330/65, 66, 67, 68
See application file for complete search history.

(56) References Cited

U.S. PATENT DOCUMENTS 4,320,349 A    3/1982  Freers et al.
4,376,287 A *  3/1983  Sechi ............................ 257/668
(Continued)

FOREIGN PATENT DOCUMENTS

DE        103 33 229          2/2005
JP        2007019585 A       10/1992
(Continued)

OTHER PUBLICATIONS

Fukuden et al., "A 4.5 GHz 40 Watt GaAs FET Amplifier", 1982 IEEE MTT-S International Microwave Symposium Digest, Jun. 15-17, 1982, pp. 66-68.
(Continued)

*Primary Examiner* — Steven J Mottola
(74) *Attorney, Agent, or Firm* — Dority & Manning, P.A.

(57) ABSTRACT

An apparatus (20) for use as an amplifier has a transistor (26) for providing signal amplification, a heat pipe or circulated fluid heat sink (22) and a thermal interface device (24) for providing mechanical and thermal connection between the transistor (26) and the heat sink (22). In use, to facilitate efficient transfer of heat/thermal energy from the transistor (26) to the heat sink (22), the plate (24) is provided between the heat sink (22) and the transistor (26). The plate (24) connects the heat sink (22) to the transistor (26) and provides a thermal conduit therebetween.

14 Claims, 8 Drawing Sheets

(51) Int. Cl.
*H01L 23/36* (2006.01)
*H01L 23/367* (2006.01)
*H01L 23/373* (2006.01)
*H01L 23/427* (2006.01)
*H01L 21/00* (2006.01)
*H01L 23/492* (2006.01)

(56) References Cited

U.S. PATENT DOCUMENTS

| | | |
|---|---|---|
| 4,967,201 A | 10/1990 | Rich, III |
| 5,208,554 A | 5/1993 | Endler et al. |
| 5,276,585 A | 1/1994 | Smithers |
| 5,313,099 A | 5/1994 | Tata et al. |
| 5,931,222 A | 8/1999 | Toy et al. |
| 6,075,701 A | 6/2000 | Ali et al. |
| 6,680,576 B2 | 1/2004 | Jeon |
| 2002/0062950 A1 | 5/2002 | McCullough et al. |
| 2006/0214286 A1 | 9/2006 | Sir et al. |
| 2007/0053166 A1 | 3/2007 | Hwang et al. |
| 2007/0069369 A1 | 3/2007 | Hou et al. |
| 2007/0114009 A1 | 5/2007 | Xia et al. |
| 2007/0137838 A1 | 6/2007 | Foster et al. |
| 2008/0067668 A1 | 3/2008 | Shi et al. |

FOREIGN PATENT DOCUMENTS

| | | |
|---|---|---|
| JP | H04296103 A | 10/1992 |
| JP | 2006108388 A | 4/2006 |
| JP | 2009295916 A | 12/2009 |

OTHER PUBLICATIONS

JP Examination Report for the corresponding JP Application No. 2013-519149, mailed on Mar. 3, 2015, 3 pages.

* cited by examiner

APPARATUS AND METHOD FOR THERMAL INTERFACING

FIELD OF THE INVENTION

This invention relates to apparatus and methods for thermal interfacing and, in particular, but not exclusively, to apparatus and methods for interfacing high power transistors, such as microwave and high power radio frequency (RF) transistors, to heat sink components. The apparatus and methods of the invention may be used, for example, in industrial and/or medical microwave applications.

BACKGROUND TO THE INVENTION

High power amplifiers, such as radio frequency (RF) and microwave amplifiers, are typically constructed using high power, high frequency transistors built around a biasing and signal input/output circuit board, the transistors being encapsulated into standard flange mount packaging.

In use, high power amplifiers generally dissipate a large proportion of their operating energy as heat and, in some cases, from about 40% to about 90% of the operating energy of the amplifier may be lost as generated heat.

A number of means for managing this generated heat have been proposed.

For example, flange mount packaging may be bolted directly to a housing of the amplifier for heat transfer purposes.

A heat sink, such as a finned heat sink, may be provided in order to transfer heat to the surrounding atmosphere. In some instances, the amplifier housing may be bonded to the heat sink.

A forced air cooling fan may be provided to assist in directing heat from the amplifier and, in some instances, a cooling fan may be provided in addition to a heat sink to improve the effectiveness of the heat sink.

While the provision of a heat sink and/or a fan may assist in dissipating heat generated by the amplifier, the heat sink and fan components add significantly to the volume occupied by the amplifier resulting in a relatively bulky device. For example, a heat sink will often comprise relatively large volumes of metal, such as aluminum or other conductor, and a large number of fins to dissipate the heat. Thus, when using a heat sink the relatively small transistor has to heat up a significant volume of material, such as metal, for a long period of time before thermal equilibrium is achieved, which is not efficient.

More recently, heat sinks developed for the microprocessor industry have evolved at a significant pace resulting in highly compact and efficient devices capable of removing high levels of heat from very compact footprints. For example, some microprocessor heat sinks utilise heat pipe technology which is highly efficient at removing heat using conduction and convection, or circulating fluid heat pipe technology. The heat pipes are located close to the surface of the heat sink which contacts the hot surface. Examples of heat pipe heat sinks may also use the latent heat of a fluid (for example, ethanol, acetone, water, sodium or mercury), solid high conductivity conductors or a circulated cooling fluid to extract the heat away from the hot surface to a heat exchanger or radiator which may or may not be fan assisted. Examples of known heat-pipe based microprocessor heat sinks include the Zalman VF2000 (RTM) VGA/CPU fan embedded solid heat-pipe, TS Heatronics NCU-1000 (hydrofluorocarbon-134a liquid vapour heat pipe) and the Corsair H70 (pumped water heatsink with fan assisted heat exchanger).

Microprocessor heat sinks are specifically designed to couple directly onto the heatspreader of a modern microprocessor CPU. The heatspreader is the physical surface (typically the top) of the CPU encapsulating case. The CPU heatspreader is flat and may be polished to facilitate maximum heat transfer into the heatsink. A microprocessor heatsink usually has features that are compatible with the CPU socket (or CPU slot) which is the mechanical component that provides mechanical and electrical connection between the microprocessor and the computer motherboard. (an example of a CPU socket is the Intel LGA 775).

With any heat sink, in order to facilitate efficient transfer of heat from a transistor to the heat sink, it is desirable to minimize the number of thermal junctions between the transistor and the heat sink, since each junction acts as an insulating layer reducing the heat sink efficiency. Thus, it is desirable to locate the transistor directly onto the heat sink to provide a single thermal junction.

However, heat pipe and water flow based heat sinks by their design cannot accommodate this type of direct connection. In particular, one problem associated with these heat sinks is that there is limited bulk metal between the heat pipe and the device to accommodate mounting flange bolts required to fasten the transistor directly to the heat sink.

Furthermore, it is necessary to extract the heat from transistors that are used in high power amplifiers in a very precise fashion.

In addition, a transistor may require a good electrical ground contact to a mounting flange which may not be provided if the transistor is bonded using an electrically insulating thermal paste.

SUMMARY OF THE INVENTION

According to a first aspect of the present invention, there is provided an apparatus for use as an amplifier comprising:
a transistor for providing signal amplification;
at least one circuit board to contain input signals to and/or output signals from the transistor; and
a thermal interface device configured to facilitate mechanical and thermal connection between the transistor and a heat sink.

The heat sink may comprise a heat pipe heat sink or a circulating fluid heat sink. The heat sink may comprise a microprocessor heat sink.

In use, an apparatus according to embodiments of the present invention can be used to connect a transistor, for example a radio frequency (RF) or microwave transistor, to a heat pipe or circulating fluid heat sink, for example a heat pipe based microprocessor heat sink, to facilitate heat transfer from the transistor to the heat sink and then to atmosphere.

Through incorporating heat pipe or circulating fluid heat sink technology with microwave or radio frequency power transistors an improvement in the thermal dissipation and significant reduction in the weight and size of the amplifier devices can be obtained.

The transistor may be a power transistor that has an output power in the range 1 W to 10,000 W, optionally in the range 1 W to 1000 W, further optionally in the range 20 W to 200 W.

The transistor may have an output power per unit surface area in the range 1 W/cm$^2$ to 100 W/cm$^2$, optionally in the range 80 W/cm$^2$ to 100 W/cm$^2$.

The interface device may be of any suitable form. In particular embodiments, the interface device may comprise a mechanical body, such as a plate, adapted for location between the transistor and a heat sink.

The interface device may be formed to engage the heat sink. For example, the interface device may comprise at least one geometric and/or mechanical feature configured to engage, or mate with part of the heat sink. The interface device may comprise a male portion configured to engage a corresponding female portion provided on a heat sink, or vice-versa.

The interface device may comprise at least one geometrical feature that is substantially the same as at least one geometrical feature of a CPU socket (or CPU slot) thereby to facilitate engagement with a microprocessor heat sink.

By reducing or minimizing the mass of the interface device between the transistor and a heat sink, heat can be efficiently transferred to the heat sink which can then be expelled to atmosphere.

In operation, there is at least one thermal path between the transistor and the thermal interface device, and a main one of the at least one thermal paths may conduct more heat than any other of the thermal paths from the transistor to the thermal interface device, and said main one of the at least one thermal paths may be not via the circuit board.

In operation, when the thermal interface device is engaged with the heat sink there may be at least one thermal path between the transistor and the heat sink, and a main one of the at least one thermal paths may conduct more heat than any other of the thermal paths from the transistor to the heat sink, and said main one of the at least one thermal paths may be not via the circuit board.

The interface device may be directly coupled to the transistor. In use, the interface device may be directly coupled to the transistor to provide two thermal junctions between the transistor and the heat sink. For example, heat may pass directly from the transistor to the interface device via a first thermal junction (the material interface between the transistor and the device) and then from the interface device to the heat sink via a second thermal junction (the material interface between the device and the heat sink).

The interface device may be directly coupled to the transistor by any suitable means. For example, the device may be coupled to the transistor by mechanical fasteners such as screws and/or by an adhesive bond. Alternatively, or in addition, the interface device may comprise at least one geometric and/or mechanical feature configured to engage, and/or mate with, part of the transistor. For example, the interface device may comprise a female portion configured to engage a corresponding male portion provided on the transistor, or vice-versa.

Alternatively, the interface device may be indirectly coupled to the transistor. For example, a septum or wall may be defined between the transistor and the interface device. In particular embodiments, the septum may comprise part of a housing of the apparatus. Alternatively, the septum may comprise a separate component of the apparatus. In use, the interface device may be indirectly coupled to the transistor to provide at least three thermal junctions between the transistor and the heat sink. For example, heat may pass from the transistor to the septum via a first thermal junction (the material interface between the transistor and the septum), from the septum to the interface device via a second thermal junction (the material interface between the septum and the interface device) and from the interface device to the heat sink via a third thermal junction (the material interface between the interface device and the heat sink).

The apparatus may further comprise a housing configured to contain, or provide mounting for, at least one of the transistor, the circuit board and the interface device. The housing may be of any suitable form. In particular embodiments, the housing may comprise a machined aluminum carrier or box.

The transistor may comprise a packaged transistor and, in use, the interface device may be configured to facilitate connection between the transistor packaging and a heat sink.

The thermal interface device may be configured in such a way as to provide minimal thermal contact with the housing thereby removing the heat efficiently from the transistor to atmosphere. For example, the interface device may be offset from the housing so that the bulk of the interface device does not directly contact the housing, this assisting to reduce conduction of heat between the interface device and the housing. An air gap may be provided between the housing and the interface device so that heat may preferentially be directly from the transistor to the interface device.

The interface device may be configured to transfer heat from a plurality of components or locations. For example, the interface device may be configured to transfer heat from multiple heat spots created by a chain or parallel arrangement of high power transistor devices. Alternatively, a microwave circulator and high power load may be used for protection of an amplifier, this generating heat which can also be transferred via the interface device.

The interface device may be configured to accommodate a plurality of heat sink elements to increase the heat sinking capacity. For example, the heat sink elements may comprise a plurality of microprocessor heat sinks. Alternatively, or in addition, the heat sink elements may comprise at least one standard finned convector heat sink. Accordingly, the interface device may be adapted for use with a number of microprocessor heat sinks or combinations of microprocessor heat sinks and standard finned convector heat sinks.

At least part of the interface device may comprise a material, or one or more combination of materials, which provides an electrical ground for the transistor. The material may comprise an electrically conductive material. Any suitable material may be used. In particular embodiments, the material may comprise at least one of copper, silver and/or aluminum.

At least part of the interface device may comprise a material, or one or more combination of materials, which is thermally conductive. Any suitable material may be used. In particular embodiments, the material may comprise a material possessing high thermal conductivity such as copper, silver and/or aluminum, for example.

At least part of the interface device may comprise a material, or one or more combination of materials, possessing substantially unidirectional thermal conductivity properties. Any suitable material or combination of materials may be used. In some embodiments, the material may comprise one or more of a pyrolytic carbon based material, for example TC1050® manufactured by Momentive Performance Materials Inc, a polyethylene polymer nanofibre material and/or a carbon nanotube composite material.

At least part of the interface device may be electroplated or otherwise coated to enhance electrical conductivity and prevent surface oxidation. For example, at least part of the interface device may be coated with silver (Ag) or gold (Au).

A material possessing extremely high thermal conductivity properties may be provided on and/or below the transistor to enhance thermal conductivity into the thermal interface device. The high thermal conductivity material may, for example, comprise a pyrolytic carbon based material, and in particular embodiments the high thermal conductivity material may comprise TC1050®.

To maintain electrical performance, at least part of the thermally conductive material or materials may be electroplated or otherwise coated to enhance electrical conductivity. For example, at least part of the material may be coated with silver (Ag) or gold (Au).

Accordingly, an apparatus according to embodiments of the present invention can be used to connect a transistor, for example a radio frequency (RF) or microwave transistor, to a heat pipe or circulating fluid heat sink, for example a heat pipe based microprocessor heat sink or circulating fluid microprocessor heat sink, to facilitate heat transfer from the transistor to the heat sink and then to atmosphere.

According to a second aspect of the present invention there is provided a combination of an apparatus according to the first aspect and a heat pipe heat sink.

According to a further, independent aspect of the present invention, there is provided a thermal interface device according to the first or second aspect.

According to a further, independent aspect of the present invention, there is provided a method of thermally interfacing a transistor and a heat sink for use in an amplifier, comprising the steps:

providing a transistor for providing signal amplification;
providing at least one circuit board to contain input signals to and output signals from the transistor; and
providing a thermal interface device configured to facilitate mechanical and thermal connection between the transistor and a heat pipe heat sink.

It should be understood that the features defined above in accordance with any aspect of the present invention may be utilised, either alone or in combination with any other defined feature, in any other aspect of the invention.

BRIEF DESCRIPTION OF THE DRAWINGS

These and other aspects of the present invention will now be described, by way of example only, with reference to the accompanying figures, in which.

DETAILED DESCRIPTION

Figures 1A, 1B:
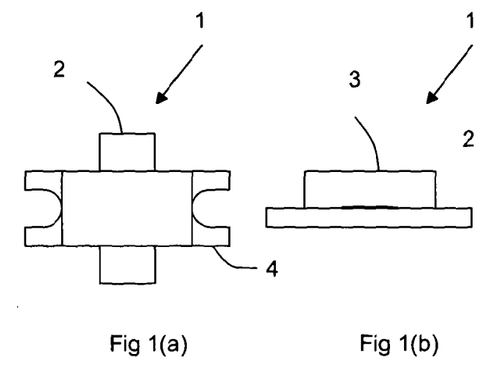
FIGS. 1(a), 1(b) and 1(c) show diagrammatic top, side and ends views of a high power transistor.
Figure 1C:
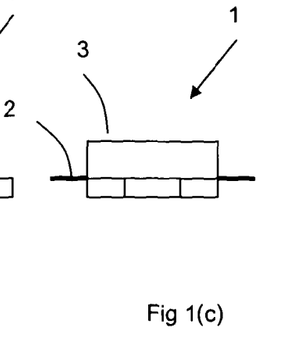

With reference initially to FIGS. 1(a), 1(b) and 1(c) of the drawings, there is shown top, side and ends views of a high power transistor 1. The transistor 1 comprises a radio frequency (RF) microwave high power transistor, such as a CREE CGH25120F GaN HEMT, and comprises electrical signal connection tabs 2, mounting base flange 3 and transistor encapsulation 4.

Figure 2:
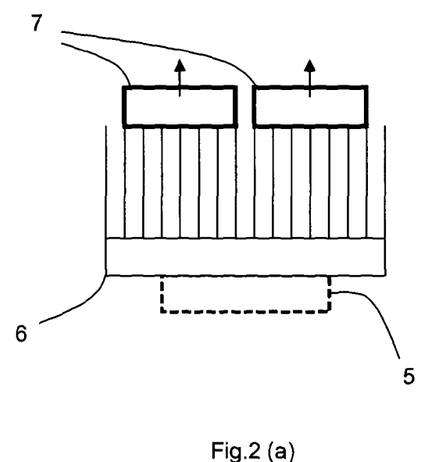
FIGS. 2(a) and 2(b) are schematic side and top views of a known amplifier, convection heat sink and fan arrangement.

The transistor 1 is mountable onto a circuit board (not shown) and housed in a shielded box (not shown) to form an amplifier, which is shown schematically as reference numeral 5 in FIGS. 2(a), 2(b) and FIG. 3.

As noted above, high power amplifiers typically dissipate a relatively high proportion of their operating energy as heat due to inefficiency. To prevent damage to the amplifier 5, and as shown in FIGS. 2(a) and 2(b), a finned heat sink 6 may be provided in known arrangements to remove heat from the amplifier 5 and dissipate this heat to the environment. The heat sink 6 may be assisted by one or more fans 7 which direct warm air 7 away from the heat sink 6. However, this arrangement is typically quite bulky as the heat sinking requirements will dictate the surface area and airflow required to dissipate the heat energy to the environment.

Figure 3A:
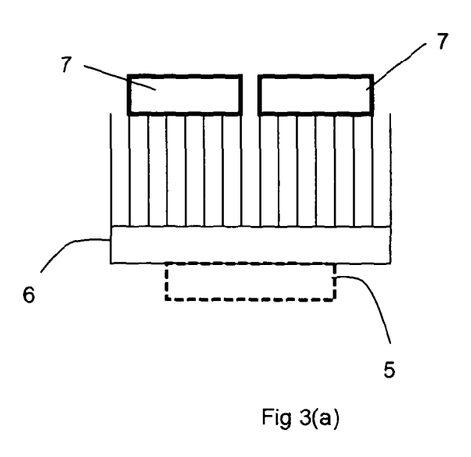
FIG. 3 is a schematic side view of a heat pipe heat sink and an amplifier shown next to a convection heat sink and amplifier for comparison.
Figure 3B:
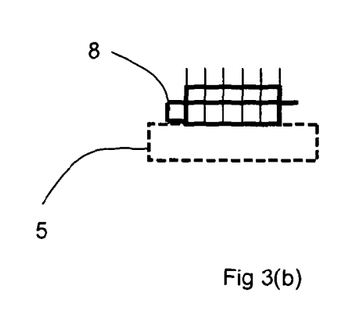

An alternative heat sink in the form of heat pipe heat sink 8 is shown in FIG. 3(b). By way of comparison, FIG. 3(a) shows a finned convection heat sink 6, which is similar or identical to the heat sink 6 shown in FIGS. 2(a) and 2(b). The amplifier 5 is also shown in each of FIGS. 3(a) and 3(b) so that the relative size may be understood.

FIG. 4(a) shows the components of an apparatus 20 according to an embodiment of the present invention, the components shown separately for ease of reference. As shown in the Figure, the apparatus 20 comprises a heat sink in the form of heat pipe microprocessor heat sink 22, a thermal interface device in the form of plate 24, and a high power transistor 26. Heat sink 22 may be similar or identical to a heat pipe heat sink 8 shown in FIG. 3(b) above. In alternative embodiments, the heat sink may comprise a circulating fluid heat sink 23 such as illustrated in FIG. 4(b), in which a cooling fluid is passed around a circulation path 25, usually by a pump (not shown). High power transistor 26 may comprise a radio frequency (RF) microwave high power transistor, such as a CREE CGH25120F GaN HEMT, similar or identical to transistor 1 shown in FIGS. 1(a) to 1(c). The transistor may be any other packaged RF/Microwave power transistor operating at least one frequency in the range from 100 MHz to 100 GHz. An RF/Microwave power transistor may be a transistor that produces saturated output power in the range of 1 to 1000 W or above. In the example of the CGH40120FE GaN HEMT transistor the output power is 120 W and heat generated is approximately 50 W. A microwave power transistor may be based upon any semiconductor compound which may include GaN, LDMOS, Silicon, GaAs or any other semiconductor material.

In use, to facilitate efficient transfer of heat/thermal energy from the transistor 26 to the heat sink 22, the plate 24 is provided between the heat sink 22 and the transistor 26. The plate 24 connects the heat sink 22 to the transistor 26 and provides a thermal conduit therebetween.

Figure 5:
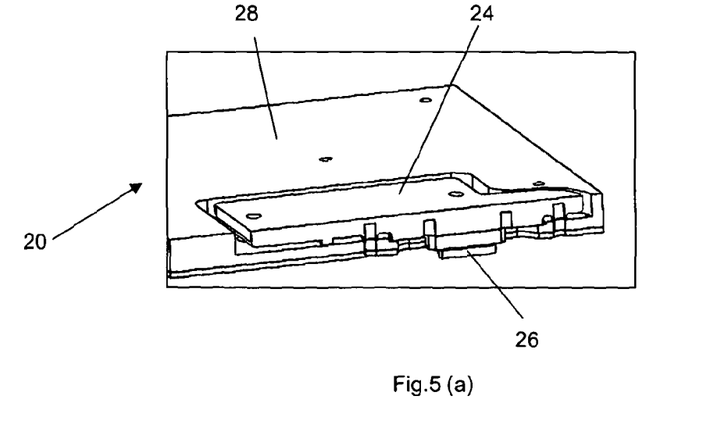
FIGS. 5(a) and 5(b) are diagrammatic perspective section views of a first embodiment of the present invention showing a thermal interface device and power transistor mounted to an amplifier circuit housing.
Figure 6:
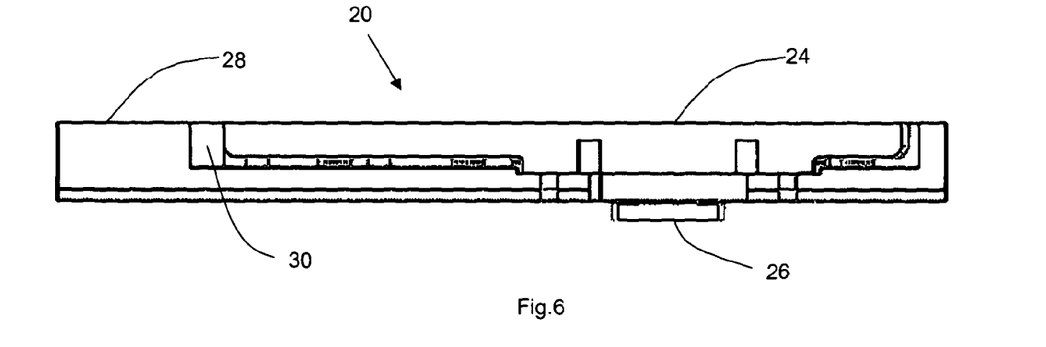
FIG. 6 is a diagrammatic cross section view of the embodiment of FIGS. 5a and 5b.

FIGS. 5(a) and 5(b) are diagrammatic perspective section views of a first embodiment of the present invention and FIG. 6 is a diagrammatic cross section view of the embodiment shown in FIGS. 5a and 5b. As shown, the plate 24 and the high power transistor 26 are mounted to an amplifier circuit housing 28. The thermal interface plate 24 is configured for minimal contact with the circuit housing 28 by virtue of an air gap 30, the air gap 30 acting to reduce thermal conductivity from the high power transistor 26 to the circuit housing 28.

Figure 4:
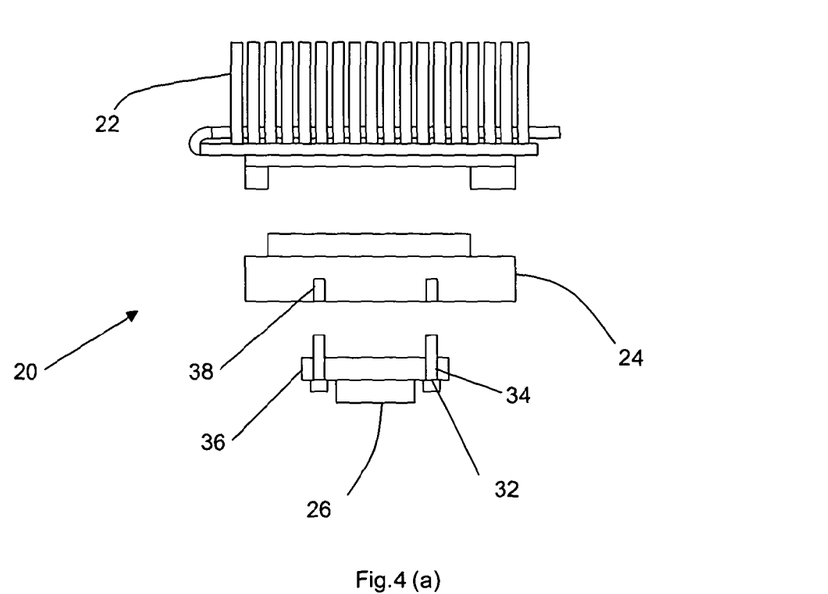
FIG. 4a is a diagrammatic view of a heat pipe microprocessor heat sink, a thermal interface device and a high power transistor of an apparatus according to an embodiment of the present invention, the components shown separately for ease of reference
FIG. 4b is a schematic diagram of a circulating fluid heat sink.

In this embodiment, and with reference also to FIG. 4, the high power transistor 26 is attached directly to the thermal interface plate 24 via screws 32 inserted through holes 34 in a flange mount 36 of transistor 24 and into screw holes 38 provided in interface plate 24. However, other suitable means of fixing or bonding the transistor to the plate 24 may be employed.

In this embodiment, two thermal junctions exist between the high power transistor 26 and the microprocessor heat sink 22, a first junction provided by the material interface between the transistor 26 and the interface plate 24 and a second junction provided by the material interface between the interface plate 26 and the heat sink 22. The interface plate 24 permits the interconnection of the high power transistor 26 and a microprocessor heat sink 22, the plate 24 providing a mechanical interface and a thermal conduit between the transistor 26 and the heat sink 22.

To enhance the thermal conductivity across the junctions, a heat sink compound, for example "Arctic Silver #5", may be applied between the power transistor 26 and the thermal interface plate 24 and/or between the thermal interface plate 24 and the microprocessor heat sink 22.

Figure 7:
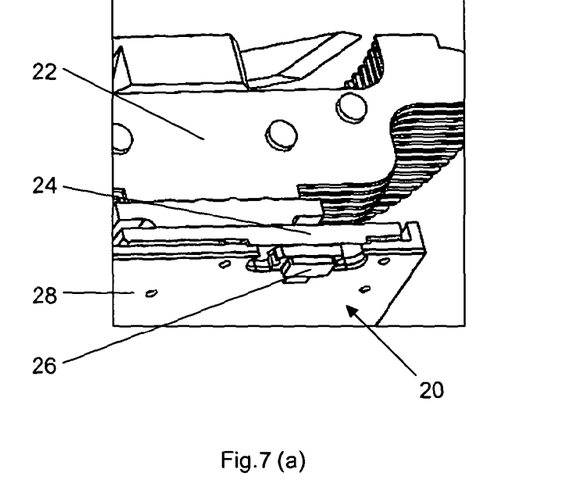
FIGS. 7(a) and 7(b) are diagrammatic cross section views of the apparatus of FIGS. 4 to 6 together with a Zalman VF2000® VGA/CPU fan-embedded heat sink connected to the apparatus.

The assembled high power transistor 26, thermal interface plate 24, microprocessor heat sink 22 and housing 28 are illustrated in FIGS. 7(a) and 7(b) which show diagrammatic cross section views of the apparatus 20 of FIGS. 4 to 6 together with a Zalman VF2000® VGA/CPU fan-embedded heat sink 22 connected to the apparatus 20.

Figure 8:
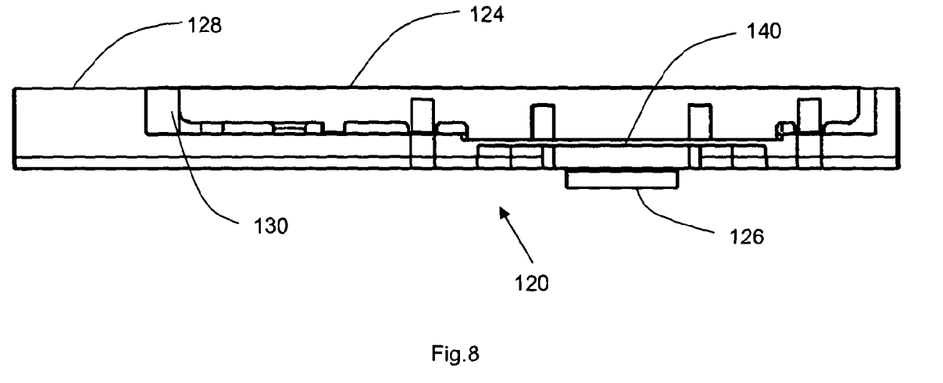
FIG. 8 is a diagrammatic cross section view of an alternative embodiment of the present invention showing a thermal interface device mounted into an amplifier circuit housing where a power transistor is mounted onto the circuit housing and is separated from the thermal interface device by a thin septum region.
Figure 9:
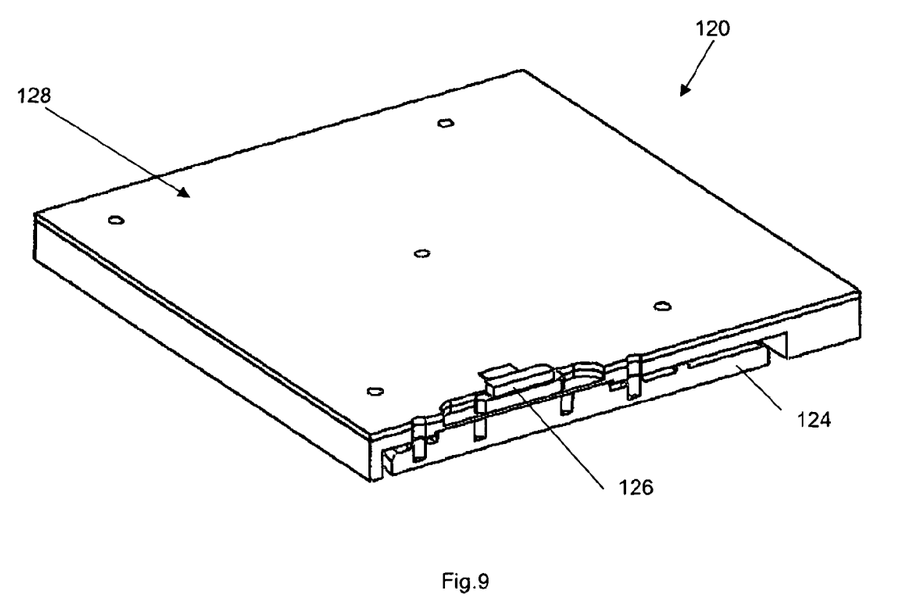
FIG. 9 is an alternative perspective cross section view from below of the apparatus of FIG. 8.

With reference to FIGS. 8 and 9, there shown a diagrammatic cross section view and a perspective section view of an apparatus according to an alternative embodiment of the present invention, like components between the first and second embodiments represented by like numerals incremented by 100. As shown, apparatus 120 has a thermal interface device, in the form of interface plate 124, mounted into an amplifier circuit housing 128. A high power transistor 126 is mounted onto the circuit housing 128 and is separated from the thermal interface plate 124 by a thin septum region 140.

As with the first embodiment, the thermal interface plate 124 is configured for minimal contact with the circuit housing 128 by virtue of an air gap 130, the air gap 130 acting to reduce thermal conductivity from the high power transistor 126 to the circuit housing 128.

The septum 140 maintains the electrical ground plane within the transistor 126/amplifier apparatus 120 and prevents leakage through any gaps to the outside. Such gaps can also affect the performance of the transistor 126/amplifier apparatus 120 by introducing unwanted parasitic inductance or capacitance.

In this second embodiment, three thermal junctions exist between the high power transistor 126 and the microprocessor heat sink 122, a first junction provided by the material interface between the transistor 126 and the septum 140, a second junction provided by the material interface between the septum 140 and the interface plate 124 and a third junction provided by the material interface between the interface plate 124 and the heat sink 122.

In this embodiment, heat sink compound, for example "Arctic Silver #5", may be applied between the power transistor 126 and the internal face of the circuit housing septum 140 and/or between the external face of the circuit housing septum 140 and the thermal interface plate 124 and/or between the thermal interface plate 124 and the microprocessor heat sink 122.

Figure 10:
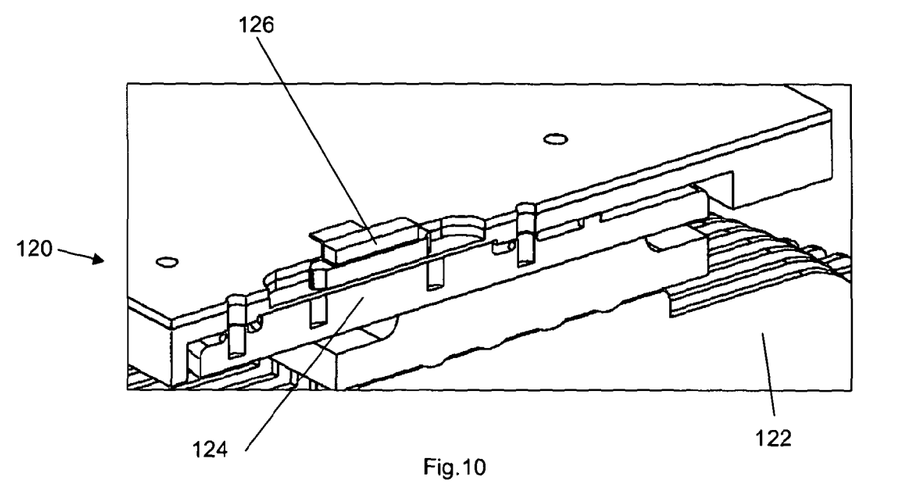
FIGS. 10 and 11 are diagrammatic cross section views of the apparatus of FIGS. 8 and 9 together with a Zalman VF2000® heat sink connected to the apparatus.
Figure 11:
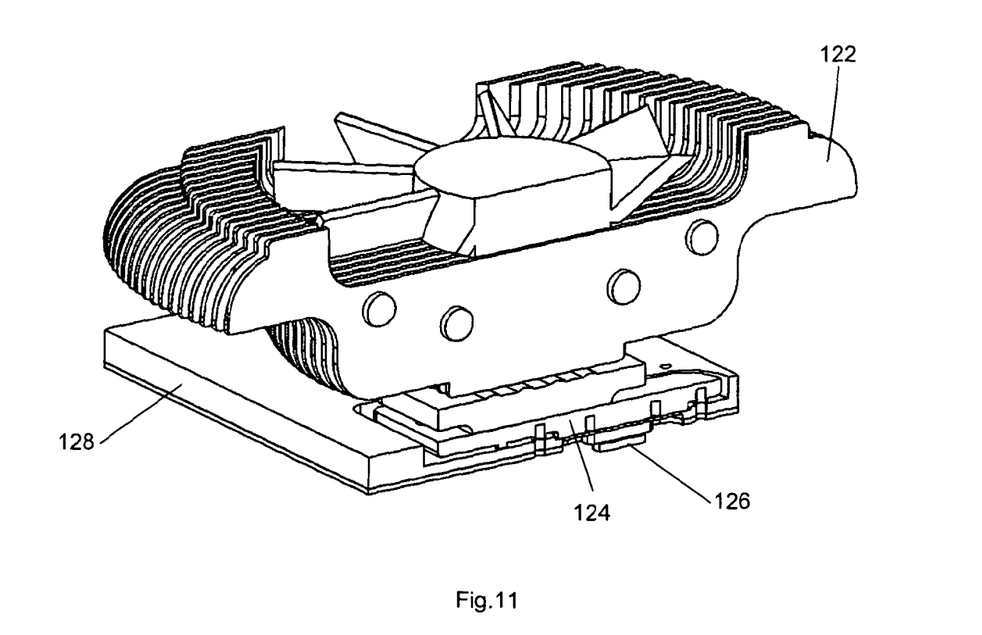

The complete arrangement including high power transistor 126, thermal interface plate 124 and microprocessor heat sink 122 are illustrated in FIGS. 10 and 11.

Figure 12:
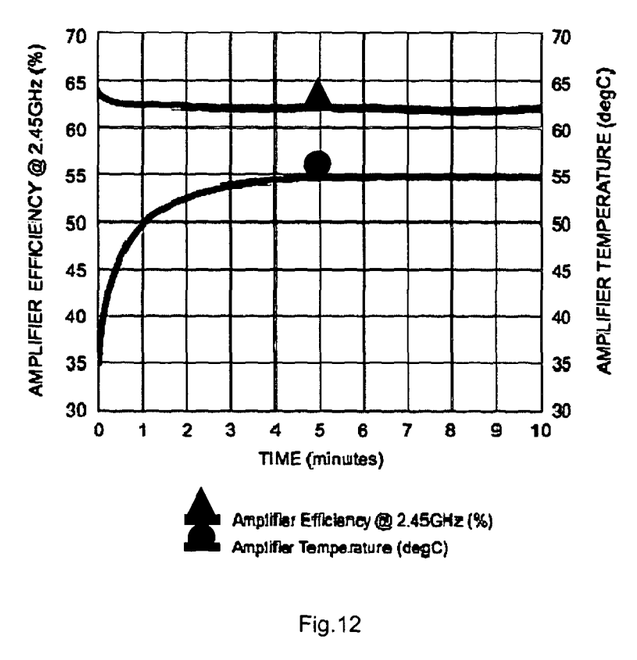
FIG. 12 is a graph representing testing results for the arrangement shown in FIGS. 10 and 11.

FIG. 12 is a graph representing testing results for the arrangement shown in FIGS. 10 and 11. The graph plots amplifier efficiency at 2.45 GHz on the left y-axis against time on the x-axis. The graph also plots amplifier temperature on the right y-axis against time on the x-axis.

Although embodiments described herein have described the engagement of an interface device with a heat pipe heat sink, the interface device may equally be arranged to engage with a circulating fluid heat sink, and such an arrangement is provided in alternative embodiments.

The interface device may be formed of any suitable material, for example at least one of copper, silver and/or aluminum. It is generally desirable for the interface device to have high thermal conductivity In some embodiments, at least part of the interface device comprises a material, or one or more combination of materials, possessing substantially unidirectional thermal conductivity properties. Any suitable material or combination of materials may be used. In some embodiments, the material may comprise one or more of a pyrolytic carbon based material, for example TC1050® manufactured by Momentive Performance Materials Inc, a polyethylene polymer nanofibre material and/or a carbon nanotube composite material. A material having substantially unidirectional thermal conductivity may be a material having greater thermal conductivity in one direction than in another direction.

At least part of the interface device may be electroplated or otherwise coated to enhance electrical conductivity and prevent surface oxidation. For example, at least part of the interface device may be coated with silver (Ag) or gold (Au).

A material possessing extremely high thermal conductivity properties may be provided on and/or below the transistor to enhance thermal conductivity into the thermal interface device. The high thermal conductivity material may, for example, comprise a pyrolytic carbon based material, and in particular embodiments the high thermal conductivity material may comprise TC1050®.

To maintain electrical performance, at least part of the thermally conductive material or materials may be electroplated or otherwise coated to enhance electrical conductivity. For example, at least part of the material may be coated with silver (Ag) or gold (Au).

It should be understood that the embodiments described herein are merely exemplary and that various modifications may be made thereto without departing from the scope of the invention.

For example, although it is desirable to minimise the number of thermal junctions between the transistor and the heat sink, the apparatus may be configured to provide more than three thermal junctions between the transistor and the heat sink, where appropriate.

The invention claimed is:

1. An apparatus for use as an amplifier comprising:
   a radio frequency or microwave transistor for providing signal amplification;
   at least one circuit board to provide input signals to and/or receive signals from the transistor; and
   a thermal interface device configured to facilitate mechanical and thermal connection between the transistor and a heat pipe heat sink or circulating fluid heat sink;
   wherein in use the interface device is indirectly coupled to the transistor to provide three thermal junctions between the transistor and the heat sink.

2. The apparatus of claim 1, wherein the transistor comprises a power transistor that has an output power in the range 1 W to 10,000 W, optionally in the range 1 W to 1000 W, further optionally in the range 20 W to 200 W.

3. The apparatus of claim 1. wherein the transistor has an output power per unit surface area in the range 1 W/cm$^2$ to 100 W/cm$^2$, optionally in the range 80 W/cm$^2$ to 100 W/cm$^2$.

4. The apparatus of claim 1, further comprising a septum between the transistor and the interface device.

5. The apparatus of claim 1, wherein the interface device comprises at least one geometric feature configured to engage with a part of a heat sink, for example one of a male portion and a female portion configured to mate with the other of a male portion and a female portion provided on the heat sink.

6. The apparatus of claim 1, further comprising a housing.

7. The apparatus of claim 6, wherein at least one of:
   the interface device is configured to provide minimal thermal contact with the housing;
   an air gap is provided between the housing and the interface device.

8. The apparatus of claim 1, wherein at least one of a), b) and c):
   a) the interface device is configured to accommodate a plurality of heat sink elements;
   b) the interface device is configured to accommodate a plurality of microprocessor heat sinks;
   c) the interface device is configured to accommodate at least one heat pipe heat sink and at least one standard finned convector heat sink.

9. The apparatus of claim 1, wherein at least one of:
   at least part of the interface device comprises a material which provides an electrical ground for the transistor;
   at least part of the interface device comprises an electrically conductive material.

10. The apparatus of claim 1, wherein at least part of the interface device comprises a thermally conductive material.

11. The apparatus of claim 10, wherein at least part of the interface device comprises a material possessing unidirectional thermal conductivity properties.

12. The apparatus of claim 1, wherein at least part of the interface device comprises a material selected from the group consisting of: a pyrolytic carbon based material; a polyethylene polymer nanofibre material; and/or a carbon nanotube composite material.

13. The apparatus of claim 1, wherein at least one of a), b) and c):
   a) at least part of the interface device is electroplated;
   b) a pyrolytic carbon based material is provided on and/or below the transistor;
   c) the transistor comprises a packaged transistor and, in use, the interface device is configured to facilitate connection between the transistor packaging and the heat sink.

14. A method of thermally interfacing a transistor and a heat sink for use in an amplifier, comprising the steps:
   providing a transistor for providing signal amplification;
   providing at least one circuit board to provide input signals to and receive signals from the transistor; and
   providing a thermal interface device configured to facilitate mechanical and thermal connection between the transistor and a microprocessor heat pipe heat sink or a microprocessor circulating fluid heat sink; and
   indirectly coupling the thermal interface device to the transistor to provide three thermal junctions between the transistor and the heat sink.

* * * * *